United States Patent [19]
Briggs et al.

[11] Patent Number: 6,087,852
[45] Date of Patent: Jul. 11, 2000

[54] MULTIPLEXING A SINGLE OUTPUT NODE WITH MULTIPLE OUTPUT CIRCUITS WITH VARYING OUTPUT VOLTAGES

[75] Inventors: David D. Briggs, Dallas; Fernando D. Carvajal, McKinney, both of Tex.; Chao-Chih Chiu, Taipei, Taiwan

[73] Assignee: Texas Instruments Incorporated, Dallas, Tex.

[21] Appl. No.: 09/206,871

[22] Filed: Dec. 8, 1998

Related U.S. Application Data

[60] Provisional application No. 60/068,239, Dec. 19, 1997.

[51] Int. Cl.[7] ........................ H03K 19/0175; H03L 5/00
[52] U.S. Cl. ............................. 326/68; 326/68; 326/80; 326/83; 326/86; 326/63; 326/82; 326/90; 327/333; 327/407
[58] Field of Search ...................... 326/68, 80, 83, 326/86, 63, 82, 90; 327/407, 333

[56] References Cited

U.S. PATENT DOCUMENTS

| | | |
|---|---|---|
| 5,338,978 | 8/1994 | Larsen et al. . |
| 5,408,147 | 4/1995 | Yarbrough et al. . |
| 5,455,732 | 10/1995 | Davis . |
| 5,576,641 | 11/1996 | Yoneya et al. . |
| 5,880,605 | 3/1999 | McManus ................................. 326/86 |
| 5,939,932 | 8/1999 | Lee .......................................... 327/436 |

*Primary Examiner*—Michael Tokar
*Assistant Examiner*—Vibol Tan
*Attorney, Agent, or Firm*—Alan K. Stewart; Wade James Brady, III; Frederick J. Telecky, Jr.

[57] ABSTRACT

The invention is a multiplex circuit for outputing two or more signals of different levels to a common output pad where a first output driver ($D_h$) is powered from a voltage rail having a higher voltage than at least one second output driver ($D_1$) power by a lower voltage rail. An interface circuit (IFC) and level shift circuit provides two output signals base on a single input signal, one signal being equivalent to the voltage of the higher voltage ($V_{High}$) and the other being based on the lower voltage ($V_{low}$). PMOS device connected to the output pad has its back gate connected to $V_{high}$ to prevent leakage current through the PMOS device when the output to the output pad ($P_1$) is equivalent to $V_{High}$.

11 Claims, 4 Drawing Sheets

| Input1 | Enable1 | INH | INL |
|--------|---------|-----|-----|
| 0 | 1 | 0 | 1 |
|   | 0 | 0 | 0 |
| 1 | 1 | 1 | 0 |

6,087,852

MULTIPLEXING A SINGLE OUTPUT NODE WITH MULTIPLE OUTPUT CIRCUITS WITH VARYING OUTPUT VOLTAGES

This application claims priority under 35 USC §119 (e) (1) of provisional application Ser. No. 60/068,239, filed Dec. 19, 1997.

FIELD OF THE INVENTION

The invention relates to multiplexed driver circuits in integrated circuits, and more particular to a multiplex circuit for outputing two signals with different voltage output levels.

BACKGROUND OF THE INVENTION

Due to the large number of output pins of semiconductor integrated circuits, it is desirable in some devices to allow an output pin to have multiple uses. That is, a pin may be used for multiple functions, the pin being multiplexed between the outputs of several circuits. Problems arise if two of the signals being driven do not have the same voltage amplitude. If an output signal is being driven from a power supply that has a larger voltage than power supplies for the other signals, the potential exists to force current into the lower voltage supplies. This will limit the voltage swing allowed on the output pin and have the potential to produce latchup in the integrated circuit.

The use of two power supples voltages of different voltage amplitudes is commonly used in integrated circuits, and the problem of isolating the circuitry which uses different voltages has been addressed in U.S. Pat. No. 5,408,147 in which two different power rails of different voltages is used. Disclosed is a first stage circuitry that is powered by a first voltage, and a second stage of PMOS transistors powered by a second higher voltage. Isolation is accomplished between the two differently powered stages by lining the PMOS transistors to the first stage through a series of controlling NMOS transistors. The PMOS transistors are completely turned off when necessary to avoid any undesirable conduction paths occurring due to the differences in the potentials of the two power rails.

Some circuits designed to overcome the problem of isolating the output pin from the power rail have utilized Schottky diodes to isolate the back gate of a PMOS output driver. Schottky diodes are not always present in every CMOS design. Also to prevent the PMOS device from conducting current in a MOS fashion, a second clamp PMOS device may be used. However, this device would have it's drain connected to the output pin with gate tied to the power supply and source connected to the gate of the output PMOS driver. The backgate of this clamp device would have to be isolated using Schottky diodes.

SUMMARY OF THE INVENTION

The invention is a time multiplex circuit for outputing two or more signals of different levels to a common output pad where a first output driver is powered from a voltage rail having a higher voltage than at least one second output driver powered by a lower voltage rail. The two signals are time multiplexed in the respect that the signals must be output, one at a time. An interface circuit and level shift circuit provides two output signals based on a single input signal, one signal being equivalent to the voltage of the higher voltage $V_{High}$ and the other being base on the lower voltage $V_{low}$. A PMOS device connected to the output pad has its back gate connected to $V_{high}$ to prevent leakage current through the PMOS back gate diode device when the output to the output pad is equivalent to $V_{High}$.

BRIEF DESCRIPTIONS OF THE DRAWINGS

DESCRIPTION OF A PREFERRED EMBODIMENT

Figure 1:
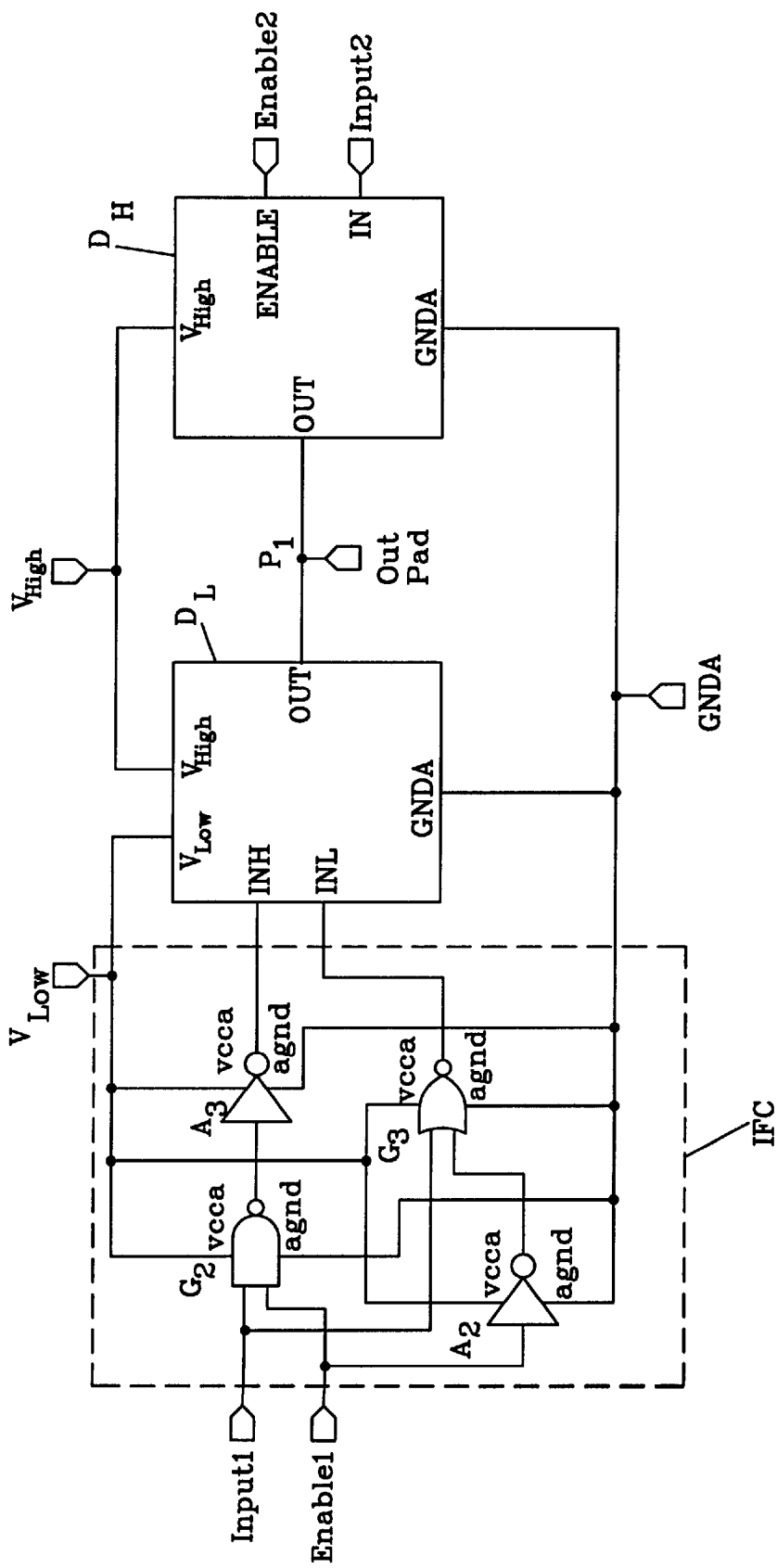
FIG. 1 shows a circuit in which two output circuits share a common output pin, each output circuit having a different voltage level, one of the output circuits being the output circuit of the present invention.

FIG. 1 schematic shows the implementation of two output circuits sharing a common output. The output of drive circuit $D_h$ is of magnitude $V_{HIGH}$ and the output of drive circuit is $D_1$ is of magnitude $V_{LOW}$ where $V_{HIGH}$ is greater than $V_{LOW}$.

FIG. 1 is divided into three basic parts, a high voltage output or driver circuit Dl, a low voltage output or driver circuit $D_1$, and a low voltage interface circuit IFC that is used to place the output of circuit $D_1$ in a high impedance state.

Driver circuits $D_h$ and $D_1$ share a common output pad $P_1$, and the signals from Input1 and Input2 are multiplexed so as to provide a single output pad for both $D_h$ and $D_1$. The ground and voltage connections are shown for the various devices as agnd and vcca, and Vhigh respectively.

The low voltage interface logic circuit IFC is used to place the output of circuit $D_1$ in a high impedance state. The circuit is enabled when Enable1 is high and that the combination of the circuit Dl and the low voltage interface circuit IFC produce a non-inverted response to Input1.

INH is generated though NAND gate $G_2$ and inverter amplifier $A_3$. INL is generated through Inverter amplifier $A_2$ and NOR gate $G_3$. When Enable1 is low the circuit $D_1$ output is placed in a high impedance state. Assuming that Enable1 is high and Input1 is high, the result will be that INH is high and INL is low. If Enable1 is high and Input1 is low, the result will be that INH is low and INL is high. If Enable1 is low both INH and INL will be low regardless of the value of Input1. The signals INH and INL will be either GNDA or VLOW depending on the values of Input1 and Enable1. A logic chart is shown in FIG. 2 showing inputs for Input1 and Enable1 and the values of INH and INL.

Figures 2, 3:
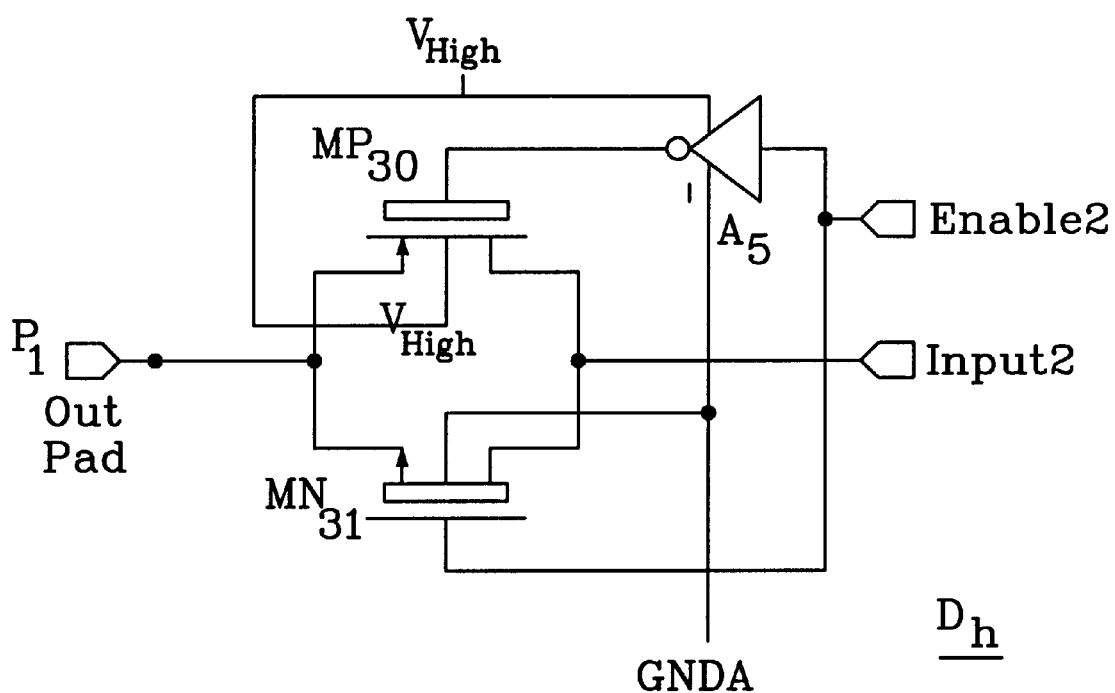
FIG. 2 is a chart showing values of INL and INH for different values of Input1 and Enable1.
FIG. 3 shows a standard signal driver supplying a high voltage signal to the common output pin.

In FIG. 2, it is seen that when Input1 is low (0), and Enable1 is high (1), then INH will be low and INL will be high. When Enable1 is low, the value of Input 1 is not material, and both INH and INL will be low. When both Input 1 and enable 1 are both high, then INH will be high and INL will be low.

FIG. 3 is a circuit of a standard output cell that can be utilized for circuit Dh. FIG. 3 shows pass transistors with an Enable2 signal to control the output. Transistor MP30 is a PMOS device and MN31 is an NMOS device. The Enable2 is applied directly to the gate of MN31 and is inverted by amplifier $A_5$ prior to application to the gate or MP30. When Enable2 is applied to MP30 and MN31, a signal on Input2 is passed through MP30 and MN31 to output Pad $P_1$. A ground connection GNDA is connected to the back gate of MN31 and to amplifier $A_5$. $V_{High}$ is applied to $A_5$ and the back gate of MP30

Figure 4:
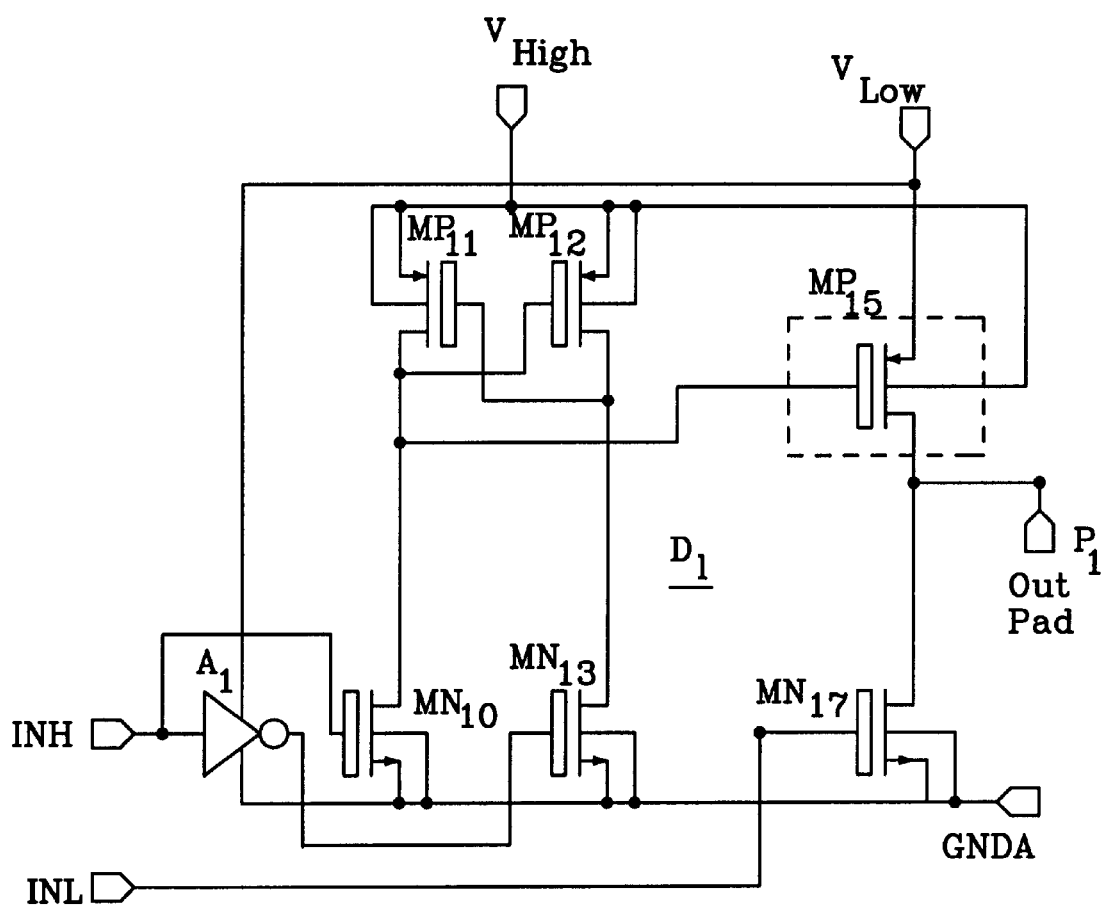
FIG. 4 shows the output circuit of the present invention that enables the outputting of a low voltage signal on the same common output pin with a high voltage output signal.

FIG. 4 shows a representative circuit that may be used for driver $D_1$. $D_1$ is meant to drive a signal with magnitude less than the magnitude of output signals generated in other output cells, such as $D_h$, sharing the same output pad P1. Amplifier $A_1$ is a standard low voltage inverter. MN13, MN10, MP11, and MP12 form a level shifter whose function is to take a signal of magnitude VLOW and convert it to a signal of magnitude VHIGH. MN13 and MN10 are NMOS while MP11 and MP12 are PMOS.

The circuit operates in response to the signal INH and the output of inverter A1. When INH=$V_{LOW}$(high) the output of inverter A3 is GNDA(low). The gate of MN13 is GNDA (low) and the gate of MN10 is $V_{LOW}$(high). This causes the gate of MP12 to become GNDA(low) and the gate of MP11 to become $V_{HIGH}$(high). These conditions now drive the gate of MP15 to GNDA(low). The gate of MN17 is driven directly from INL and should not be high when the gate of MP15 is low. The resultant output is a signal with value of $V_{LOW}$.

The unique feature of this $D_1$ is it's ability to multiplex it's output with outputs of varying magnitude. PMOS MP15 is the device which permits the multiplexing of different amplitude signals. The gate of MP15 is driven with a signal whose voltage varies from $V_{HIGH}$ to GNDA. This is critical for the multiplexing of the output with signals of $V_{HIGH}$ which are greater than $V_{LOW}$. Applying GNDA to the gate of MP15 turns the device on. Applying $V_{HIGH}$ to the gate of MP15 turns the device off and guarantees that when a signal of $V_{HIGH}$ magnitude from $D_h$ is placed on the output pad $P_1$ there is no MOS conduction through MP15 into the $V_{LOW}$ supply.

The back gate of PMOS MP15 is tied to the $V_{HIGH}$ supply. This is also critical for the multiplexing of the output with signals of $V_{HIGH}$ which are greater than $V_{LOW}$. This connection guarantees that when a signal of $V_{HIGH}$ magnitude is placed on the output pad P1 from $D_h$, there is no diode conduction through MP15 into the $V_{LOW}$ supply.

The output block, for example $D_h$, generating the highest output voltage on the output node must provide the $V_{HIGH}$ power supply.

Figure 5:
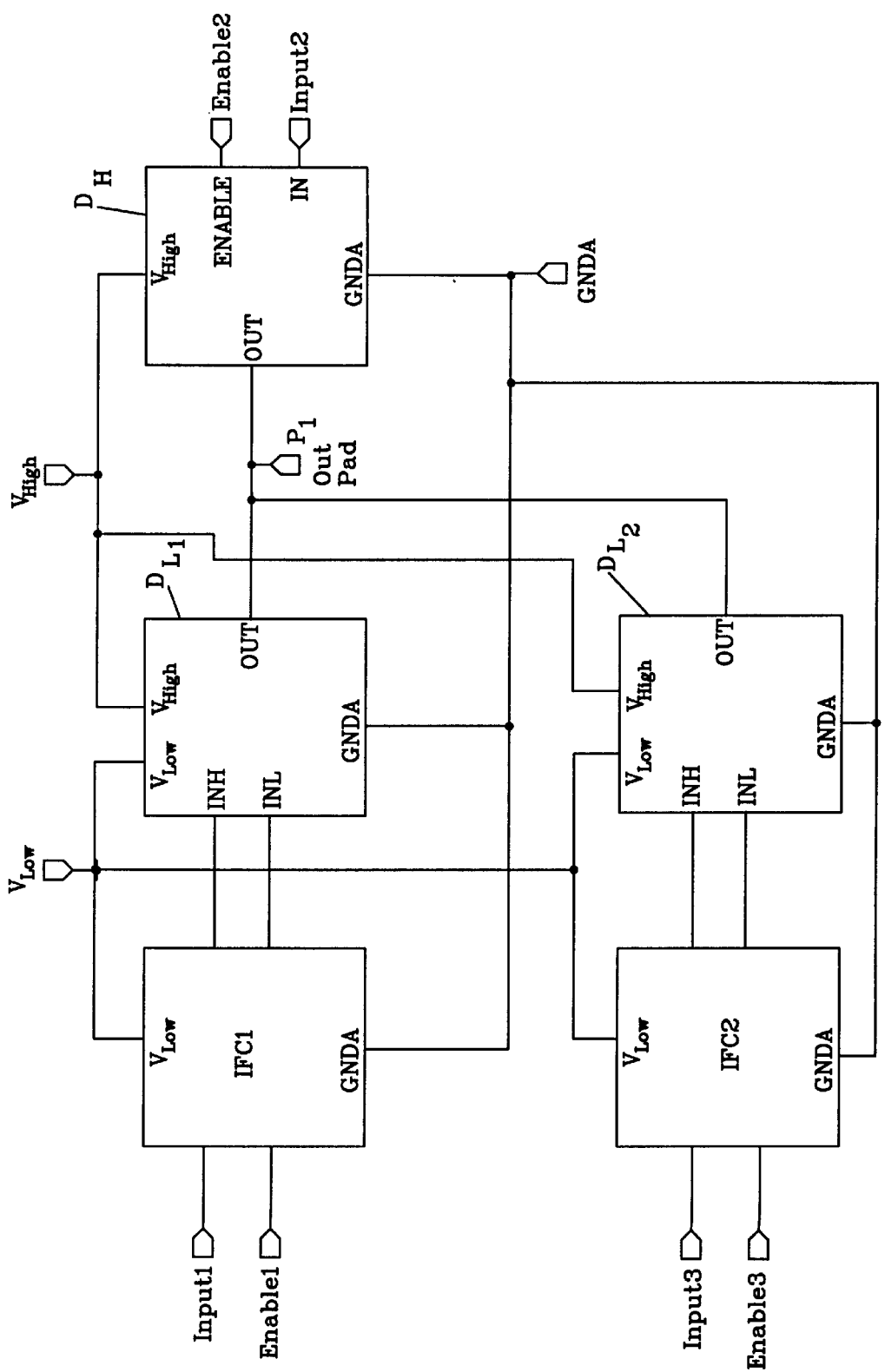
FIG. 5 shows a circuit in which three outputs are multiplexed from drivers of different level voltages.

FIG. 5 illustrates a circuit in which three driver circuits are multiplexed to a single output. In this circuit, for example, driver $D_H$ is a high voltage tristate driver and drivers $D_{L1}$ and $D_{L2}$ are lower voltage drivers. Both $D_{L1}$ and $D_{L2}$ are circuits the same as $D_1$ in FIG. 4. Each of $D_{L1}$ And $D_{L2}$ have interface circuits IFC1 and IFC2 (voltage level shifters), respectively, the same as IFC in FIG. 1. The inputs Input1, Input3, when enabled with Enable1 and Enable3, respective, place the outputs of $D_{L1}$ and $D_{L2}$ in a high impedance to prevent leakage conductance when DH places a high voltage output on output pad $P_1$.

What is claimed:

1. A multiplex circuit for outputing multiple signal of different voltage levels on a common output pad, comprising:

a first driver circuit connected to a first power supply $V_{High}$ for outputting signals of a first voltage level on said common output pad, a second driver circuit connected to a second power supply $V_{Low}$ having a lower voltage level than the first power supply, for outputing signals of a second voltage level, lower than said first voltage level, on said common output pad; and a PMOS output device having a back gate connection used as part of the second driver circuit, with the back gate connection connected to the first voltage supply to prevent conduction through the PMOS device when a signal of magnitude of $V_{High}$ is placed on the common output pad.

2. The multiplex circuit according to claim 1, including a low voltage interface circuit for placing said second driver circuit in a high impedance state.

3. The multiplex circuit according to claim 2, wherein said interface circuit provides both low and high input signals to said second driver circuit.

4. The multiplex circuit according to claim 1, wherein said second driver circuit includes a level shifter to shift a low level input signal to a level equivalent to $V_{High}$.

5. The multiplex circuit according to claim 2, wherein said level shifting circuit includes a pair of NMOS and a pair pf PMOS devices to provide to shift the low level input signal to a level equivalent to $V_{High}$.

6. The multiplex circuit according to claim 1, including an interface circuit for providing a low input signal and a high input signal to said second driver, said low input signal and high input signal based upon a single input signal.

7. A multiplex circuit for outputting multiple signal of different voltage levels on a common output pad, comprising:

a first driver circuit connected to a first power supply $V_{High}$ for outputting signals of a first voltage level on said common output pad, a second driver circuit connected to a second power supply $V_{Low}$ having a lower voltage level than the first power supply, for outputting signals of a second voltage level, lower than said first voltage level, on said common output pad;

a low voltage interface circuit for placing said second driver circuit in a high impedance state; and a PMOS output device having a back gate connection used as part of an output circuit for the second driver circuit, with the back gate connection connected to the first voltage supply to prevent conduction through the PMOS device when a signal of magnitude of $V_{High}$ is placed on the common output pad.

8. The multiplex circuit according to claim 7, wherein said interface circuit provides both low and high input signals to said second driver circuit.

9. The multiplex circuit according to claim 7, wherein said second driver circuit includes a level shifter to shift a low level input signal to a level equivalent to $V_{High}$.

10. The multiplex circuit according to claim 9, wherein said level shifting circuit includes a pair of NMOS and a pair of PMOS devices to provide to shift the low level input signal to a level equivalent to $V_{High}$.

11. The multiplex circuit according to claim 7, including an interface circuit for providing a low input signal and a high input signal to said second driver, said low input signal and high input signal based upon a single input signal.

* * * * *